United States Patent [19]

Sato

[11] Patent Number: 5,233,239
[45] Date of Patent: Aug. 3, 1993

[54] ECL CIRCUIT WITH FEEDBACK CIRCUITRY FOR INCREASED SPEED

[75] Inventor: Hiroaki Sato, Tokyo, Japan

[73] Assignee: NEC Corporation, Tokyo, Japan

[21] Appl. No.: 880,835

[22] Filed: May 11, 1992

[30] Foreign Application Priority Data

May 9, 1991 [JP] Japan .................................. 3-102944

[51] Int. Cl.$^5$ .................. H03K 19/013; H03K 19/086
[52] U.S. Cl. ........................................ 307/443; 307/455
[58] Field of Search ............... 307/455, 443, 494, 552, 307/359

[56] References Cited

U.S. PATENT DOCUMENTS

| | | | |
|---|---|---|---|
| 4,329,597 | 5/1982 | Yamagiwa | 307/455 |
| 4,532,440 | 7/1985 | Barre | 307/455 |
| 4,818,896 | 4/1989 | Cavanna | 307/455 |

*Primary Examiner*—Edward P. Westin
*Assistant Examiner*—Benjamin D. Driscoll

[57] ABSTRACT

An ECL output circuit comprises a current switching circuit of the differential circuit type including a first transistor having a base connected to receive an input voltage and a second transistor having a base connected to a first reference voltage. A third transistor of an emitter follower has a base connected to a collector of the second transistor and an emitter connected to an output terminal. There is also provided an output level detection and feedback circuit including a differential circuit composed of fourth and fifth transistors having their emitters connected in common to a constant current. The fourth transistor has a base connected to the output terminal and a collector connected to the common-connected emitters of the first and second transistors. The fifth transistor has a base connected to a second reference voltage which determines a low level voltage of an output voltage. A sixth transistor is connected in parallel to the fifth transistor and has a base connected to receive the input voltage. Thus, it becomes unnecessary to lower the low level voltage of the output voltage, and the operating margin is not reduced. In addition, a high switching speed can be obtained.

2 Claims, 2 Drawing Sheets

ECL CIRCUIT WITH FEEDBACK CIRCUITRY FOR INCREASED SPEED

BACKGROUND OF THE INVENTION

1. Field of the Invention

The present invention relates to an ECL (emitter coupled logic) output circuit.

2. Description of Related Art

One typical ECL output circuit includes a current switch circuit composed of a pair of transistors connected in the form of simple differential circuit, and an emitter follower composed of a third transistor receiving an output of the current switch circuit (See "LSI Handbook" edited by Electronics and Communication Society in Japan and published by OHM-sha in 1984, page 464, FIG. 1.26).

In ordinary cases, a pull-down resistor is connected to an output terminal of the emitter follower so as to form an ECL interface. Generally, the pull-down resistor is 50Ω and terminated to −2 V. In addition, the ECL output circuit is featured in that the emitter follower can can easily realize a wired-OR.

When the above mentioned ECL output circuit is used to form the wired-OR or when a plurality of ECL output circuits are connected to the same bus, a low level voltage of an output voltage elevates, and therefore, an operating margin such as "fan-out number" decreases. In order to avoid this problem, if the low level voltage is set to −1.9 V which is lower than an ordinary low level voltage of −1.6 V, a switching is delayed because of an increased voltage difference, in comparison with the case in which the low level voltage is the ordinary low level voltage of −1.6 V and the high level voltage is an ordinary high level voltage −0.8 V.

SUMMARY OF THE INVENTION

Accordingly, it is an object of the present invention to provide an ECL output circuit which has overcome the above mentioned defect of the conventional one.

Another object of the present invention is to provide an ECL output circuit having a wide operating margin and a high switching speed.

The above and other objects of the present invention are achieved in accordance with the present invention by an ECL output circuit comprising: a current switching circuit including first and second transistors connected in the form of a differential circuit, the first transistor having a base connected to receive an input voltage, the second transistor having a base connected to a first reference voltage, emitters of the first and second transistors being connected in common to a first constant current source; an emitter follower including a third transistor having a base connected to a collector of the second transistor and an emitter connected to an output terminal; and an output level detection and feedback circuit including a fourth transistor having a base connected to the output terminal and a collector connected to the common-connected emitters of the first and second transistors, a fifth transistor having a base connected to a second reference voltage which determines a low level voltage of an output voltage, and a sixth transistor having a base connected to receive the input voltage and a collector connected to a collector of the fifth transistor, emitters of the fourth, fifth and sixth transistors being connected in common to a second constant current source.

The above and other objects, features and advantages of the present invention will be apparent from the following description of preferred embodiments of the invention with reference to the accompanying drawings.

DESCRIPTION OF THE PREFERRED EMBODIMENTS

Figure 1:
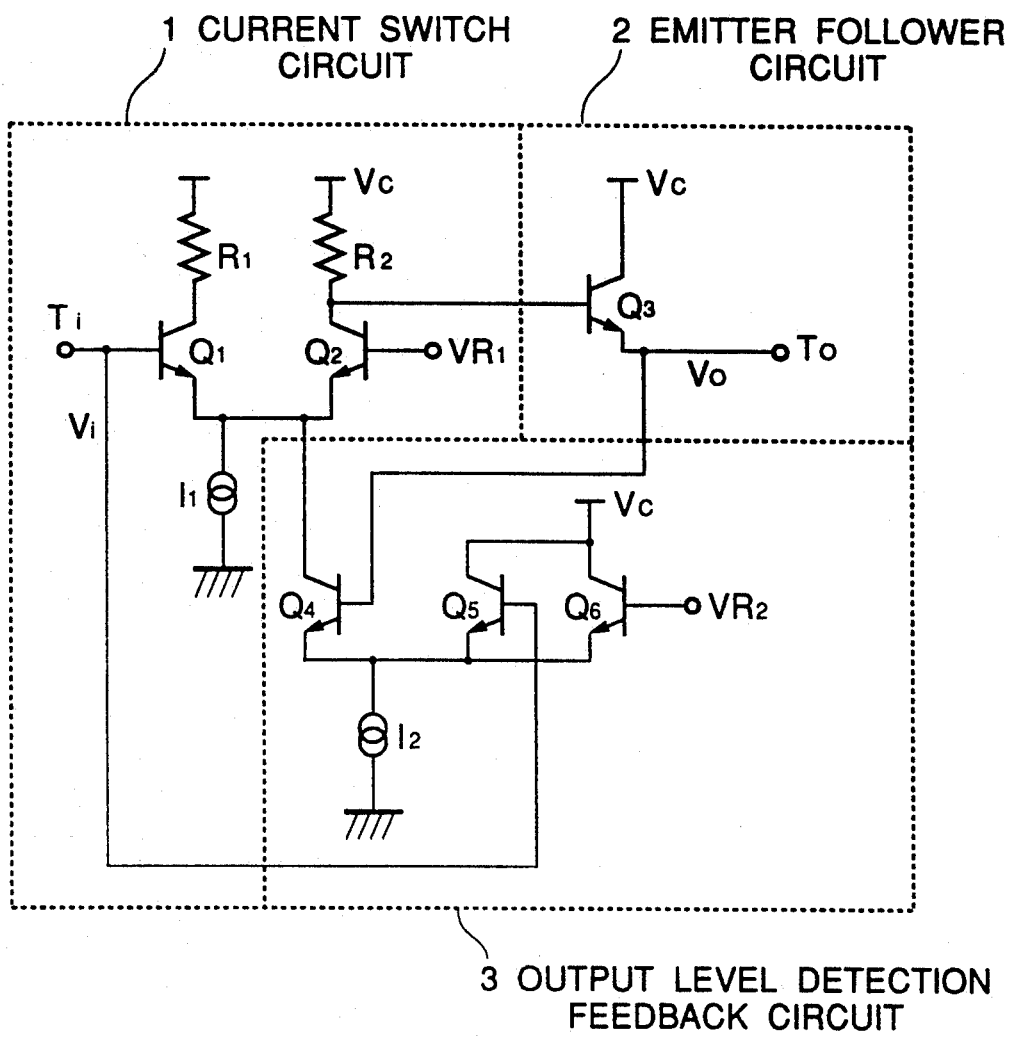
FIG. 1 is a circuit diagram of one embodiment of the ECL output circuit in accordance with the present invention.

Referring to FIG. 1, there is shown a circuit diagram of one embodiment of the ECL output circuit in accordance with the present invention.

The ECL output circuit includes a current switching circuit 1, an emitter follower 2 and an output level detection and feedback circuit 3, as shown in FIG. 1.

The current switching circuit 1 is in the form of a differential circuit which includes a differential input transistor Q1 and a differential output transistor Q2. A base of the differential input transistor Q1 is connected to an input terminal Ti so as to receive an input voltage Ti. A collector of the transistor Q1 is connected through a resistor R1 to a voltage supply voltage VC. A base of the differential output transistor Q2 is connected to a first reference voltage VR1. A collector of Q2 is connected through a resistor R2 to the voltage supply voltage VC. Emitters of the transistors Q1 and Q2 are connected in common to one end of a first constant current source I1, which has its other end grounded.

The emitter follower 2 includes a transistor Q3 having a base connected to a collector of the differential output transistor Q2 and an emitter connected to an output terminal To. A collector of the transistor Q3 is connected to the voltage supply voltage VC.

The output level detection and feedback circuit 3 includes a feedback transistor Q4 having a base connected to the output terminal To and a collector connected to the common-connected emitters of the transistors Q1 and Q2 of the current switching circuit 1. An emitter of the transistor Q4 is connected to one end of a second constant current source I2, which has its other end grounded. A reference transistor Q6 has a base connected to a second reference voltage VR2 which a low level voltage VOL of an output voltage VO. A collector of the transistor Q6 is connected to the voltage supply voltage VC. An input transistor Q5 has a base connected to receive the input voltage Vi and a collector connected to a collector of the reference transistor Q6. Emitters of the input transistor Q5 and the reference transistor Q6 and the emitter of the feedback transistor Q4 are connected in common to the second constant current source I2. Thus, the transistors Q4 and Q6 constitute another differential circuit.

Now, operation of the circuit will be described with reference to FIG. 2, assuming that in order to prevent the delay of the switching, the low level voltage VOL of the output voltage VO is set to be −1.7 V, which is slightly lower than the ordinarily low level voltage of −1.6 V. On the other hand, the high level voltage VOH of the output voltage VO is set to be −0.8 V of the ordinarily high level voltage. In addition, the second reference voltage VR2 is set at the ordinary low level voltage of −1.6 V.

When the input voltage Vi is at a low level, and therefore when the output voltage VO is also at a low level, the differential output transistor Q2 is turned on, and the base potential of the emitter follower transistor Q3 is a voltage which is lower than the voltage supply voltage VC by a voltage drop of the resistor R2, namely (R2×I1).

At this time, if the low level voltage VOL of the output voltage VO is −1.7 V which is lower than −1.6 V of the second reference voltage VR2, the reference transistor Q6 is turned on and the feedback transistor Q4 is turned off. Therefore, no feedback is given to the current switch circuit 1, so that the low level voltage VOL of the output voltage VO remains unchanged and accordingly is maintained at −1.7 V.

Figure 2:
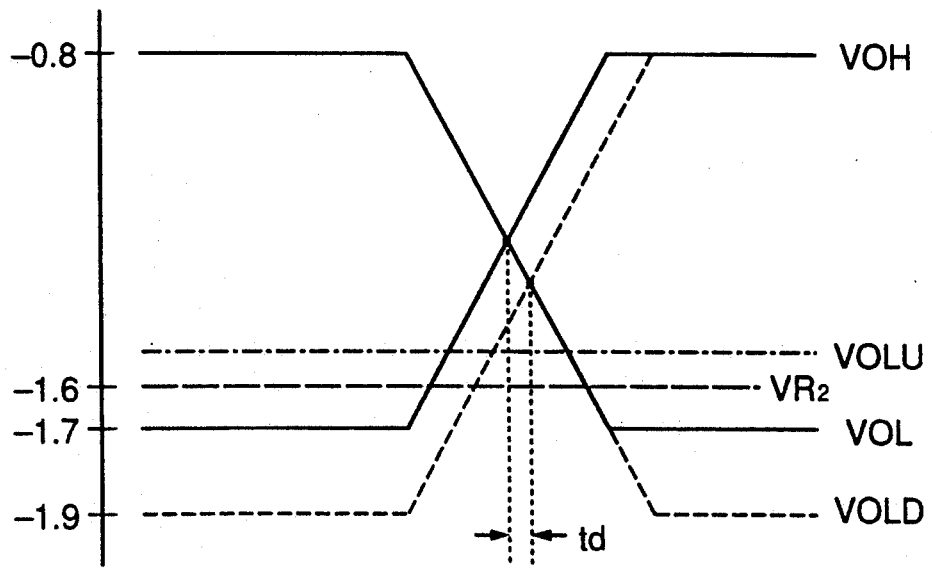
FIG. 2 is a waveform diagram illustrating an operation of the ECL circuit shown in FIG. 1.

To the contrary, if the low level voltage of the output voltage VO is higher than −1.6 V of the second reference voltage VR2, as shown by the double-dotted chain line VOLU in FIG. 2, namely, if the output low level voltage VOL elevates, the feedback transistor Q4 is turned on, so that the second constant current I2 is added to the emitter current of the differential output transistor Q2. Namely, the emitter current of the differential output transistor Q2 becomes (I1+I2). Therefore, the base potential of the emitter follower transistor Q3 is a voltage which is lower than the voltage supply voltage VC by a voltage drop of {R2×(I1+I2)}. In other words, the base potential of the emitter follower transistor Q3 is lower than that of the case having no feedback circuit 3, by a voltage drop of (R2×I2).

Ordinarily, when output voltages of two ECL output circuits are coupled by the wired-OR, the low level voltage of the output voltage will elevate by about 20 mV. However, if it designed that the load resistor R2 has a resistance of 250Ω and the second constant current source I2 has a current capacity of 100 μA, the low level voltage of the output voltage can be dropped by 25 mV. Accordingly, the low level voltage of the output voltage will never exceed −1.6 V of the second reference voltage VR2, and therefore, the operating margin cannot be narrowed.

For reference, in the ECL output circuit having no output level detection and feedback circuit 3, if the low level voltage of the output voltage is set to −1.9 V which is lower than the ordinary low level voltage of −1.6 V, as shown by the dotted line VOLD in FIG. 2, a switching is delayed by a time td because of an increased voltage difference.

When the input voltage Vi is at a high level, and therefore when the output voltage VO is also at a high level, it is necessary to ensure that the output level detection and feedback circuit 3 does not operate. Otherwise, the high level voltage VOH would drop. For this purpose, the input transistor Q5 having the base connected to receive the input voltage Vi will turn on without exception when the input voltage Vi is at a high level. Therefore, since the transistor Q4 is not turned on, the high level voltage VOH will be in no way decreased by the output level detection and feedback circuit 3. In this case, the relation between the input voltage Vi and the output voltage VO is required to fulfil the condition that Vi>VO at the time of a high level voltage, and Vi<VO at the time of a low level voltage. In other words, the amplitude of the input voltage Vi is larger than that of the output voltage. This may adversely influence on the switching speed.

Figure 3:
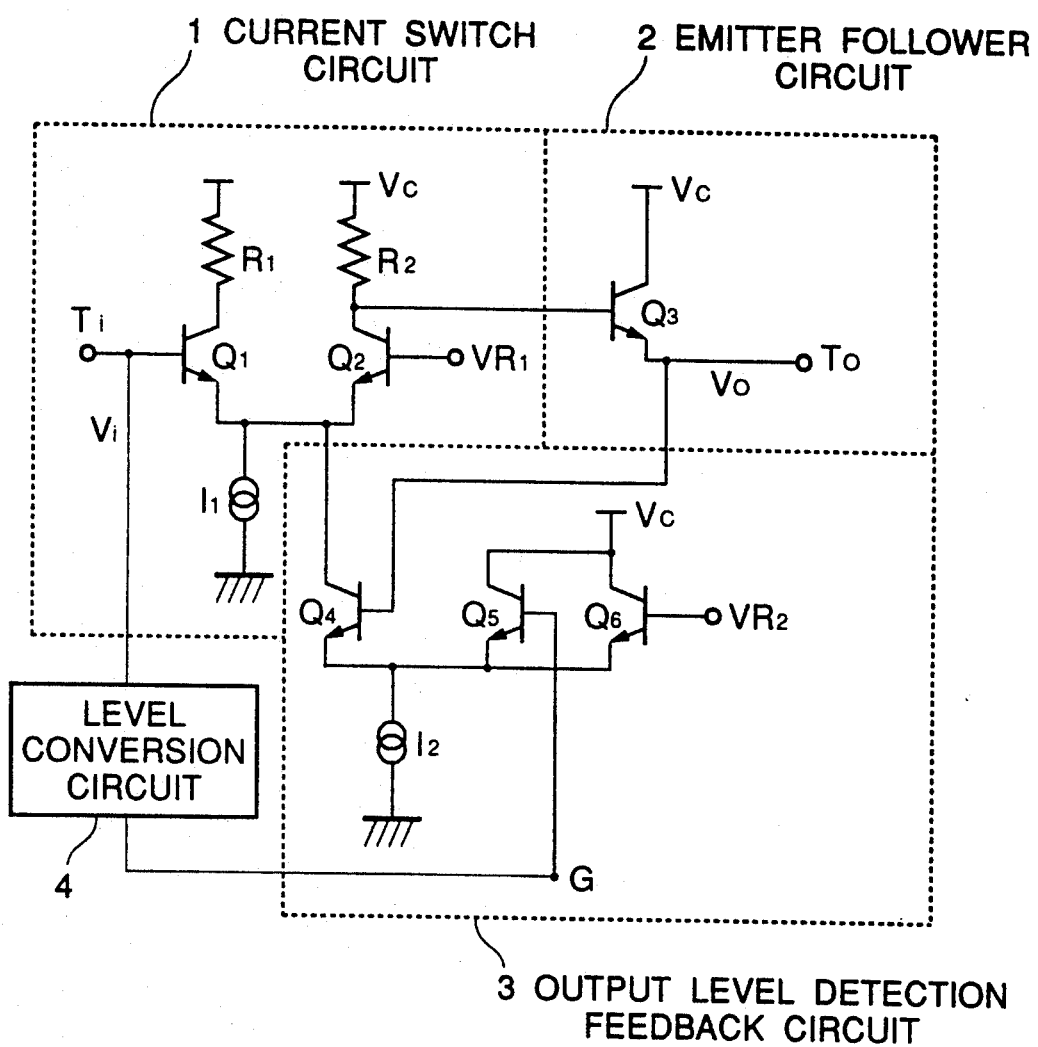
FIG. 3 is a circuit diagram of a modification of the ECL output circuit shown in FIG. 1.

Turning to FIG. 3, there is shown a circuit diagram of a modification of the ECL output circuit shown in FIG. 1. In this modification, a level conversion circuit 4 is inserted between the input terminal Ti and the base of the input transistor Q5. Thus, the low level voltage and the high level voltage of the input voltage Vi are amplified, and the amplified input voltage is applied to the base of the input transistor Q5. Therefore, even if the amplitude of the input voltage Vi is the same as that of the output voltage, the same effect can be obtained. In addition, it is possible to prevent a propagation delay caused by a large input amplitude.

As seen from the above, since the ECL output circuit in accordance with the present invention has the output level detection and feedback circuit, it becomes necessary to lower the low level voltage of the output voltage, and the operating margin is not reduced. In addition, a high switching speed can be ensured.

The invention has thus been shown and described with reference to the specific embodiments. However, it should be noted that the present invention is in no way limited to the details of the illustrated structures but changes and modifications may be made within the scope of the appended claims.

I claim:

1. An ECL output circuit comprising:

a current switching circuit including first and second transistors connected in the form of a differential circuit, said first transistor having a base connected to receive an input voltage, said second transistor having a base connected to a first reference voltage, emitters of said first and second transistors being connected in common to a first constant current source;

an emitter follower including a third transistor having a base connected to a collector of said second transistor and an emitter connected to an output terminal; and an output level detection and feedback circuit including a fourth transistor having a base connected to said output terminal and a collector connected to the common-connected emitters of said first and second transistors, a fifth transistor having a base connected to a second reference voltage which determines a low level voltage of an output voltage, and a sixth transistor having a base connected to receive said input voltage and a collector connected to a collector of said fifth transistor, emitters of said fourth, fifth and sixth transistors being connected in common to a second constant current source.

2. An ECL output circuit claimed in claim 1 further including a level converting circuit having an input connected to receive said input voltage and an output connected to said base of said fifth transistor so as to supply an amplified voltage to said base of said fifth transistor.

* * * * *